(12) United States Patent
Tsuei et al.

(10) Patent No.: US 9,714,465 B2
(45) Date of Patent: Jul. 25, 2017

(54) GAS DISTRIBUTION BLOCKER APPARATUS

(75) Inventors: Lun Tsuei, Mountain View, CA (US); Alan Tso, San Jose, CA (US); Tom K. Cho, Los Altos, CA (US); Brian Sy-Yuan Shieh, Palo Alto, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1874 days.

(21) Appl. No.: 12/627,578

(22) Filed: Nov. 30, 2009

(65) Prior Publication Data

US 2010/0136216 A1  Jun. 3, 2010

Related U.S. Application Data

(60) Provisional application No. 61/118,839, filed on Dec. 1, 2008.

(51) Int. Cl.
*C23C 16/455* (2006.01)
*H01L 31/076* (2012.01)
*H01L 31/18* (2006.01)

(52) U.S. Cl.
CPC .. *C23C 16/45565* (2013.01); *C23C 16/45559* (2013.01); *H01L 31/076* (2013.01); *H01L 31/1824* (2013.01); *Y02E 10/545* (2013.01); *Y02E 10/548* (2013.01); *Y02P 70/521* (2015.11)

(58) Field of Classification Search
CPC ........ C23C 16/45565; C23C 16/45559; H01L 31/076; H01L 31/1824; Y02P 70/521; Y02E 10/545; Y02E 10/548
USPC ....................................... 118/715; 156/345.1
See application file for complete search history.

(56) References Cited

U.S. PATENT DOCUMENTS

| | | |
|---|---|---|
| 5,595,606 A | 1/1997 | Fujikawa et al. |
| 5,624,498 A | 4/1997 | Lee et al. |
| 6,284,673 B2 | 9/2001 | Dunham |
| 6,368,450 B2 | 4/2002 | Hayashi et al. |
| 6,415,736 B1 | 7/2002 | Hao et al. |
| 6,461,435 B1 | 10/2002 | Littau et al. |
| 6,537,419 B1 | 3/2003 | Kinnard |

(Continued)

FOREIGN PATENT DOCUMENTS

| | | |
|---|---|---|
| KR | 2006-0014495 | 2/2006 |
| KR | 2006-0135184 | 12/2006 |

OTHER PUBLICATIONS

PCT International Search Report and Written Opinion dated Jun. 29, 2010 for International Application No. PCT/US2009/066145.

*Primary Examiner* — Rudy Zervigon
(74) *Attorney, Agent, or Firm* — Patterson + Sheridan, LLP (57) ABSTRACT

Embodiments of the present invention generally provide apparatus and methods for altering the flow and pressure differential of process gases supplied across a showerhead of a processing chamber to provide improved deposition uniformity across the surface of a substrate disposed therein. In one embodiment, a blocker plate is disposed between a backing plate and a showerhead. In one embodiment, the distance between the blocker plate and the showerhead is adjustable. In another embodiment, the blocker plate has a non-planar surface contour. In another embodiment, a regional blocker plate is disposed between a backing plate and a showerhead. In another embodiment, a central blocker plate and a peripheral blocker plate are disposed between a backing plate and a showerhead.

18 Claims, 7 Drawing Sheets

(56) References Cited

U.S. PATENT DOCUMENTS

| | | |
|---|---|---|
| 6,565,661 B1 | 5/2003 | Nguyen |
| 6,793,733 B2 | 9/2004 | Janakiraman et al. |
| 6,942,753 B2 | 9/2005 | Choi et al. |
| 7,270,713 B2 | 9/2007 | Blonigan et al. |
| 7,429,410 B2 | 9/2008 | Keller et al. |
| 2002/0017243 A1 | 2/2002 | Pyo |
| 2002/0129769 A1 | 9/2002 | Kim et al. |
| 2003/0019580 A1* | 1/2003 | Strang ............ 156/345.33 |
| 2003/0207033 A1 | 11/2003 | Yim et al. |
| 2005/0133160 A1 | 6/2005 | Kennedy et al. |
| 2005/0133161 A1 | 6/2005 | Carpenter et al. |
| 2006/0060138 A1* | 3/2006 | Keller et al. ............ 118/715 |
| 2007/0044714 A1 | 3/2007 | White |

* cited by examiner

GAS DISTRIBUTION BLOCKER APPARATUS

CROSS-REFERENCE TO RELATED APPLICATIONS

This application claims benefit of U.S. provisional patent application Ser. No. 61/118,839, filed Dec. 1, 2008, which is herein incorporated by reference.

BACKGROUND OF THE INVENTION

Field of the Invention

Embodiments of the present invention provide a gas distribution blocker apparatus for improving deposition uniformity on large area substrates.

Description of the Related Art

As demand for larger solar panels and flat panel displays continues to increase, so must the size of substrates and chambers for processing the substrates. One method for depositing material onto a substrate for solar panels or flat panel displays is plasma enhanced chemical vapor deposition (PECVD). In PECVD, process gases are typically introduced across a showerhead in a process chamber through a central gas feed orifice. The process gases diffuse through the showerhead and are ignited into plasma by an RF current applied to the showerhead. The plasma envelops a substrate disposed in a process region of the chamber and deposits thin films on the surface of a substrate.

As substrate sizes increase, the uniformity of the films deposited on the substrate becomes increasingly difficult. Therefore, there is a need for a gas distribution blocker apparatus for altering the flow and pressure differential of process gasses across the surface of a showerhead and improving deposition uniformity on large area substrates.

SUMMARY OF THE INVENTION

In one embodiment of the present invention, a processing apparatus comprises a backing plate having an aperture coupled to a gas source, a showerhead coupled to the backing plate and having a plurality of orifices disposed from an upstream side to a downstream side thereof, and a blocker member disposed between the backing plate and the showerhead such that a first plenum is formed between the backing plate and the blocker plate and a second plenum is formed between the blocker plate and the showerhead, wherein the volume of the first plenum is adjustable with respect to the volume of the second plenum.

In another embodiment, a processing apparatus comprises a backing plate having an orifice disposed therethrough and coupled to a gas source, a showerhead positioned adjacent the showerhead such that a plenum is formed between the backing plate and the showerhead, wherein the showerhead has a plurality of gas passages disposed therethrough, and a blocker member having a plurality of gas passages disposed therethrough and coupled to the showerhead such that a first gas passage disposed through the showerhead is aligned with a gas passage disposed through the blocker member and a second gas passage disposed through the showerhead is blocked by the blocker member.

In another embodiment, a processing apparatus comprises a backing plate having an orifice formed therethrough and coupled to a gas source, a showerhead having a plurality of apertures formed therethrough and coupled to the backing plate, a blocker member having a side with a plurality of gas passages formed therethrough and a bottom having a plurality of gas passages formed therethrough, wherein the blocker member is disposed between a central region of the backing plate and a central region of the showerhead, and a spacer member coupled to the blocker member.

In yet another embodiment, a method for depositing thin films comprises introducing a gas mixture into a first plenum formed between a backing plate and a blocker member of a processing apparatus, allowing the gas mixture to diffuse through the blocker member into a second plenum disposed between the blocker member and a showerhead, depositing a thin film on a substrate, determining the uniformity of the thin film deposited on the substrate, adjusting the volume of the first plenum with respect to the second plenum, and depositing a second thin film on a second substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally provide apparatus and methods for altering the flow and pressure differential of process gases supplied across a showerhead of a processing chamber to provide improved deposition uniformity across the surface of a substrate disposed therein. In one embodiment, a blocker plate is disposed between a backing plate and a showerhead. In one embodiment, the distance between the blocker plate and the showerhead is adjustable. In another embodiment, the blocker plate has a non-planar surface contour. In another embodiment, a regional blocker plate is disposed between a backing plate and a showerhead. In another embodiment, a central blocker plate and a peripheral blocker plate are disposed between a backing plate and a showerhead.

By providing one or more blocker plates between a backing plate and a showerhead in a processing system, the pressure differential of process gases supplied across the showerhead may be altered to provide improved deposition uniformity across the surface of a substrate. Certain embodiments of the present invention may provide significant benefits for depositing microcrystalline silicon films for use in solar cell manufacturing.

The invention is illustratively described below in reference to a chemical vapor deposition system, processing large area substrates, such as a PECVD system, available from Applied Materials, Inc., Santa Clara, Calif. However, it should be understood that the apparatus and method may have utility in other system configurations.

Figure 1A:
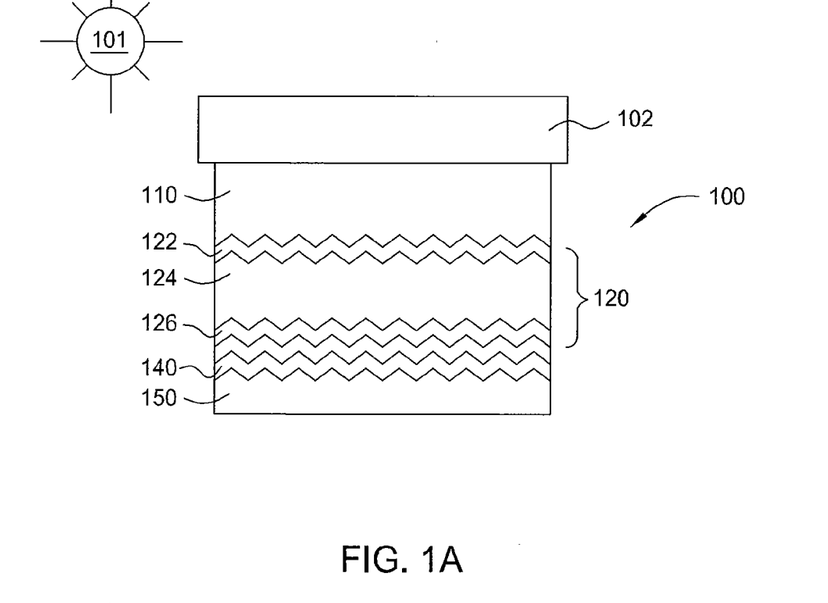
FIG. 1A is a simplified schematic diagram of a single junction solar cell that can be formed using embodiments of the present invention subsequently described.
Figure 1B:
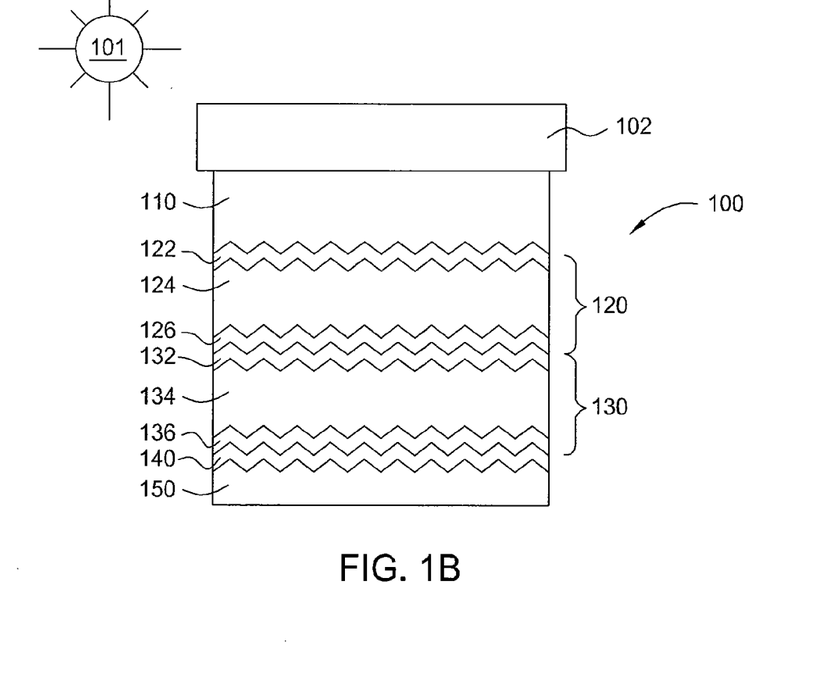
FIG. 1B is a schematic diagram of an embodiment of a solar cell, which is a multi-junction solar cell that is oriented toward the light or solar radiation.

Examples of a solar cell 100 that can be formed using embodiments of the present invention are illustrated in FIGS. 1A-1B. FIG. 1A is a simplified schematic diagram of a single junction solar cell 100 that can be formed using embodiments of the present invention subsequently described. In general, a key feature of a single junction solar cell 100 is an amorphous silicon intrinsic layer. As shown in FIG. 1A, the single junction solar cell 100 is oriented toward a light source or solar radiation 101. The solar cell 100 generally comprises a substrate 102, such as a glass substrate, polymer substrate, metal substrate, or other suitable substrate, with thin films formed thereover. In one embodiment, the substrate 102 is a glass substrate that is about 2200 mm×2600 mm×3 mm in size. The solar cell 100 further comprises a first transparent conducting oxide (TCO) layer 110 (e.g., zinc oxide (ZnO), tin oxide (SnO)) formed over the substrate 102, a first p-i-n junction 120 formed over the first TCO layer 110, a second TCO layer 140 formed over the first p-i-n junction 120, and a back contact layer 150 formed over the second TCO layer 140. To improve light absorption by enhancing light trapping, the substrate and/or one or more of thin films formed thereover may be optionally textured by wet, plasma, ion, and/or mechanical processes. For example, in the embodiment shown in FIG. 1A, the first TCO layer 110 is textured, and the subsequent thin films deposited thereover generally follow the topography of the surface below it. In one configuration, the first p-i-n junction 120 may comprise a p-type amorphous silicon layer 122, an intrinsic type amorphous silicon layer 124 formed over the p-type amorphous silicon layer 122, and an n-type amorphous silicon layer 126 formed over the intrinsic type amorphous silicon layer 124. In one example, the p-type amorphous silicon layer 122 may be formed to a thickness between about 60 Å and about 300 Å, the intrinsic type amorphous silicon layer 124 may be formed to a thickness between about 1,500 Å and about 3,500 Å, and the n-type amorphous silicon layer 126 may be formed to a thickness between about 100 Å and about 500 Å. The back contact layer 150 may include, but is not limited to a material selected from the group consisting of Al, Ag, Ti, Cr, Au, Cu, Pt, alloys thereof, and combinations thereof.

FIG. 1B is a schematic diagram of an embodiment of a solar cell 100, which is a multi-junction solar cell that is oriented toward the light or solar radiation 101. In general, key features of a multi-junction solar cell is an amorphous silicon intrinsic layer of the p-i-n junction oriented toward the light or solar radiation and a microcrystalline intrinsic layer of the following p-i-n junction. Solar cell 100 comprises a substrate 102, such as a glass substrate, polymer substrate, metal substrate, or other suitable substrate, with thin films formed thereover. The solar cell 100 may further comprise a first transparent conducting oxide (TCO) layer 110 formed over the substrate 102, a first p-i-n junction 120 formed over the first TCO layer 110, a second p-i-n junction 130 formed over the first p-i-n junction 120, a second TCO layer 140 formed over the second p-i-n junction 130, and a back contact layer 150 formed over the second TCO layer 140. In the embodiment shown in FIG. 1B, the first TCO layer 110 is textured, and the subsequent thin films deposited thereover generally follow the topography of the surface below it. The first p-i-n junction 120 may comprise a p-type amorphous silicon layer 122, an intrinsic type amorphous silicon layer 124 formed over the p-type amorphous silicon layer 122, and an n-type microcrystalline silicon layer 126 formed over the intrinsic type amorphous silicon layer 124. In one example, the p-type amorphous silicon layer 122 may be formed to a thickness between about 60 Å and about 300 Å, the intrinsic type amorphous silicon layer 124 may be formed to a thickness between about 1,500 Å and about 3,500 Å, and the n-type microcrystalline silicon layer 126 may be formed to a thickness between about 100 Å and about 400 Å. The second p-i-n junction 130 may comprise a p-type microcrystalline silicon layer 132, an intrinsic type microcrystalline silicon layer 134 formed over the p-type microcrystalline silicon layer 132, and an n-type amorphous silicon layer 136 formed over the intrinsic type microcrystalline silicon layer 134. In one example, the p-type microcrystalline silicon layer 132 may be formed to a thickness between about 100 Å and about 400 Å, the intrinsic type microcrystalline silicon layer 134 may be formed to a thickness between about 10,000 Å and about 30,000 Å, and the n-type amorphous silicon layer 136 may be formed to a thickness between about 100 Å and about 500 Å. The back contact layer 150 may include, but is not limited to a material selected from the group consisting of Al, Ag, Ti, Cr, Au, Cu, Pt, alloys thereof, and combinations thereof.

Figure 2:
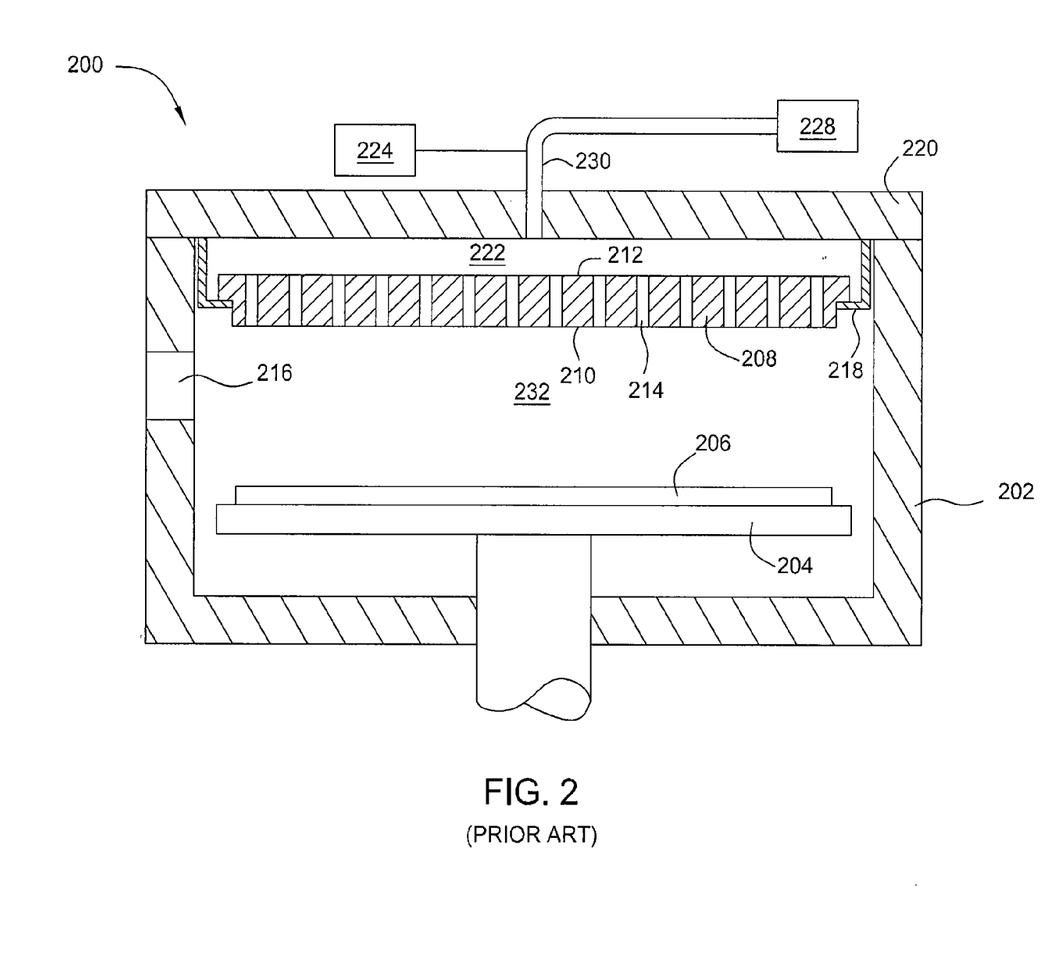
FIG. 2 is a schematic, cross-sectional view of a process chamber, which may be utilized according to one embodiment of the present invention.

FIG. 2 is a schematic, cross-sectional view of a process chamber 200, which may be utilized according to one embodiment of the present invention. The process chamber 200 includes a chamber body 202 enclosing a susceptor 204 for holding a substrate 206 thereon. The substrate 206 may comprise a glass or polymer substrate such as for solar panel manufacturing, flat panel display manufacturing, organic light emitting display manufacturing, or the like.

The substrate 206 may rest on the susceptor 204 in the chamber body 202 across a processing region 232 from a gas distribution showerhead 208. The substrate 206 may enter and exit the process chamber 200 through a slit valve opening 216 disposed through the chamber body 202.

The gas distribution showerhead 208 may be coupled to a backing plate 220 by a suspension 218. The gas distribution showerhead 208 may have a downstream surface 210 that faces the processing region 232 and the substrate 206. The gas distribution showerhead 208 may also have an upstream surface 212 disposed opposite the downstream surface 210. A plurality of gas passages 214 extend through the gas distribution showerhead 208 from the upstream surface 212 to the downstream surface 210.

Process gas may be introduced into the process chamber 200 from a gas source 228. The process gas travels from the first gas source 228 through a central region of the backing plate 220 via a gas tube 230. The gas expends into a plenum 222 formed between the backing plate 220 and the upstream surface 212 of the gas distribution showerhead 208. The process gas then diffuses through the gas distribution showerhead 208 into the processing region 232.

An RF power source 224 may be coupled to the process chamber 200 at the gas tube 230. When RF power is used, the RF current may travel along the backing plate 220, the suspension 218, and the downstream surface 210 of the gas distribution showerhead 208, where it ignites the process gas into plasma in the processing region 232.

Consistent and uniform film deposition over a large area substrate is difficult. In particular, differences in the flow and pressure of the process gas across the upstream surface 212 of the gas distribution showerhead 208 contribute to the difficulty in depositing a uniform film. Therefore, in one embodiment of the present invention, one or more blocker plates may be added between the backing plate 220 and the showerhead 208 to alter the flow and pressure differential of process gas as needed to provide the desired film deposition across the surface of the substrate.

Figure 3:
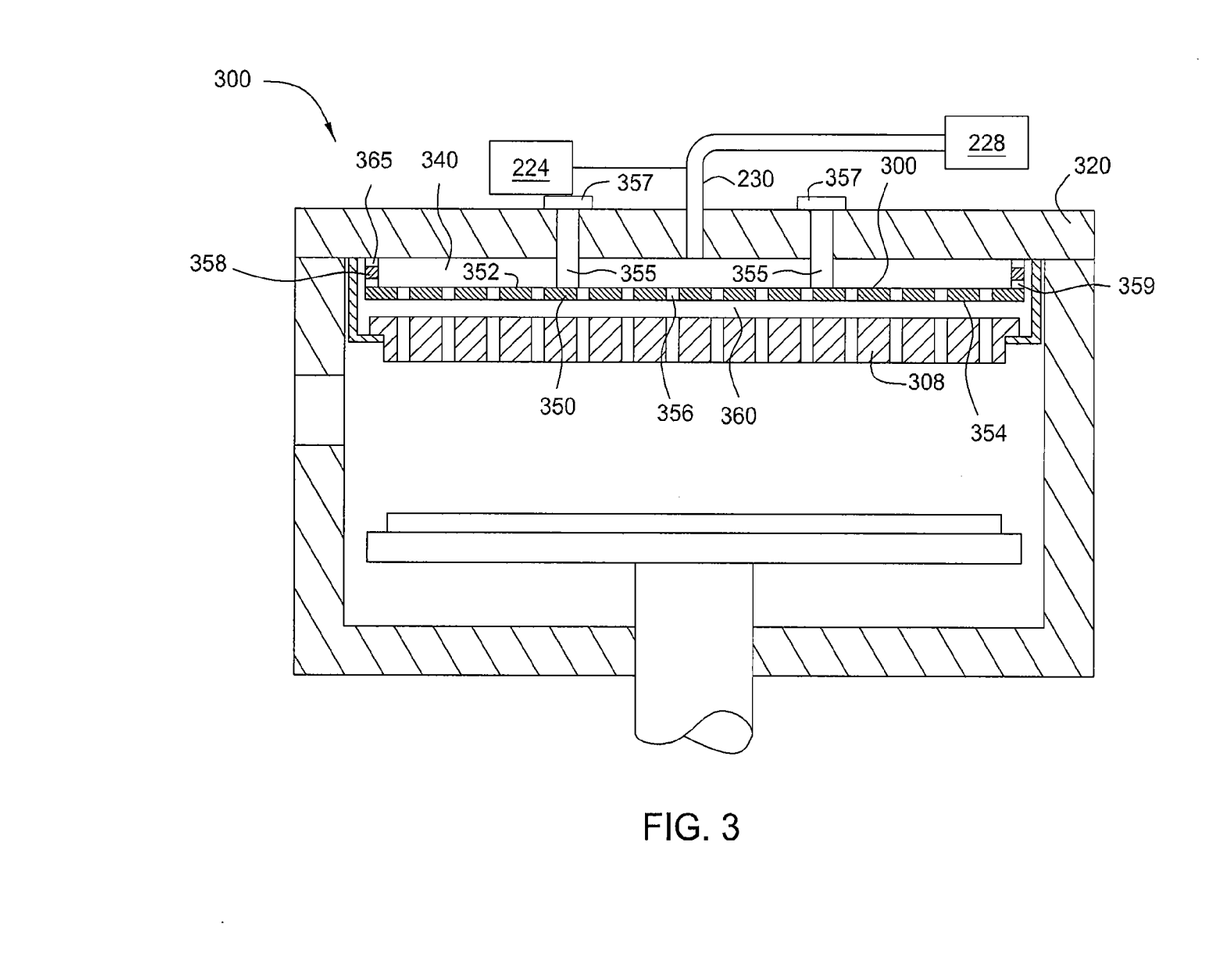
FIG. 3 is a schematic, cross-sectional view of a process chamber according to one embodiment of the present invention.

FIG. 3 is a schematic, cross-sectional view of a process chamber 300 according to one embodiment of the present invention. In one embodiment, a showerhead 308 is coupled to a backing plate 320 with a blocker plate 350 disposed therebetween. In one embodiment, the blocker plate 350 has an upstream side 352 facing the backing plate 320 and a downstream side 354 facing the showerhead 308.

In one embodiment, the blocker plate 350 is coupled to the backing plate 320. In another embodiment, the blocker plate 350 is coupled to the showerhead 308. Regardless of the side in which the blocker plate 350 is coupled, a first plenum 340 is formed between the blocker plate 350 and the backing plate 320, and a second plenum 360 is formed between the blocker plate 350 and the showerhead 308.

In one embodiment, the blocker plate 350 has a plurality of gas passages 356 formed therethrough between the upstream side 352 and the downstream side 354. In one embodiment, the downstream side 354 of the blocker plate 350 is substantially planar. In one embodiment, the sides 358 of the blocker plate 350 may have gas passages 359 disposed therethrough as well. In one embodiment, the gas passages 356 in the blocker plate 350 are not aligned with gas passages in the showerhead 308.

In one embodiment, at least one of the gas passages 356 is oriented substantially perpendicular to the downstream side 354 of the blocker plate 350. In one embodiment, at least one of the gas passages 356 is oriented at a non-perpendicular angle with respect to the downstream side 354 of the blocker plate 350. The angle of the gas passages 356 with respect to the downstream side 354 of the blocker plate 350 may be manipulated in order to provide a desirable process gas flow and pressure differential across the showerhead 308. For instance, certain gas passages 356 may be angled to focus delivery of process gas toward corner regions of the showerhead 308. Alternatively, certain gas passages 356 may be angled to focus delivery of process gas toward a central region of the showerhead 308.

In one embodiment, the size and shape of the gas passages 356 are substantially the same across the surface of the blocker plate 350. In another embodiment, the size and/or shape of the gas passages 356 is varied across the surface of the blocker plate 350. Thus, the size and shape of the gas passages 356 may be varied across the surface of the blocker plate 350 to provide a desirable process gas flow and pressure differential across the showerhead 308. For instance, the gas passages 356 in a central region of the blocker plate 350 may be larger than in other regions to focus delivery of process gas toward a central region of the showerhead 308. Alternatively, the gas passages 356 in corner regions of the blocker plate 350 may be larger than in other regions to focus delivery of process gas toward corner regions of the showerhead 308.

In one embodiment, the spacing between gas passages 356 is substantially constant across the surface of the blocker plate 350. In another embodiment, the spacing between gas passages 356 is varied across the surface of the blocker plate 350. Varying the spacing of the gas passages across the blocker plate 350 may also provide desirable process gas flow and pressure differential across the showerhead 308. In one embodiment, the gas passages 356 may be more densely configured in corner regions of the blocker plate 350 than in other regions. In another embodiment, gas passages 356 may be more densely configured in a central region of the blocker plate 350 than in other regions. Thus, the pressure differential across the showerhead 308 may be desirably controlled by the spacing of the gas passages 356 in the blocker plate 350.

In one embodiment of the present invention, spacing between the blocker plate 350 and the showerhead 308 may be varied to achieve desired flow and pressured differential of process gas. In one embodiment, one or more spacers 365 may be provided between the backing plate 320 and the blocker plate 350. In one embodiment, the thickness of spacers 365 may be altered to increase or decrease the size of the first and second plenums 340 and 360 by raising or lowering the blocker plate 350. In one embodiment, the thickness of spacers 365 may be increased in order to increase the size of the first plenum 340 and decrease the size of the second plenum 360. In another embodiment, additional spacers 365 may be added to increase the size of the first plenum 340 and decrease the size of the second plenum 360. In another embodiment, the spacing between the blocker plate and the showerhead 308 may be manipulated in situ via automatic raising and lowering of the blocker plate 350. For instance, support members 355 may attach to the blocker plate 350 and extend through the backing plate 320 where actuators 357, such as stepper motors, linear motors, or pneumatic cylinders, may raise and lower the blocker plate 350 without breaking vacuum in the process chamber 300. By varying the size of the first plenum 340 and the second plenum 360 via raising or lowering the blocker plate 350 with respect to the showerhead 308, a desirable flow and pressure differential of process gas may be achieved across the showerhead 308.

In one embodiment, the flow and pressure differential of process gas across the showerhead 308 may be altered by varying the thickness of the blocker plate 350. That is, the distance between the upstream side 352 of the blocker plate and the downstream side 354 of the blocker plate 350 may be greater in one region of the blocker plate 350, such as a peripheral region, than in another region of the blocker plate 350, such as a central region. In another embodiment, the flow and pressure differential of process gas across the showerhead 308 may be altered by varying the surface area of the blocker plate 350. For instance, in one embodiment, the surface area of the blocker plate 350 may be substantially the same as the surface area of the showerhead 308. In another embodiment, the surface area of the blocker plate may be significantly less than the surface area of the showerhead 308 by using a significantly smaller blocker plate 350.

Figure 4A:
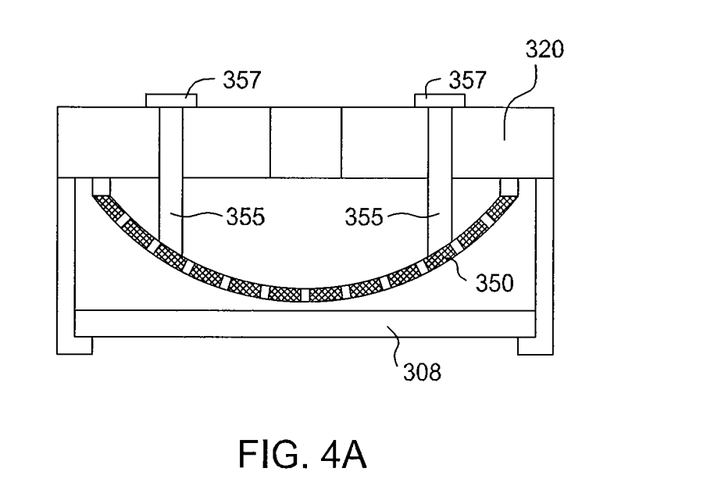
FIG. 4A is a schematic, cross-sectional view of the blocker plate in FIG. 3 with a convex surface contour.
Figure 4B:
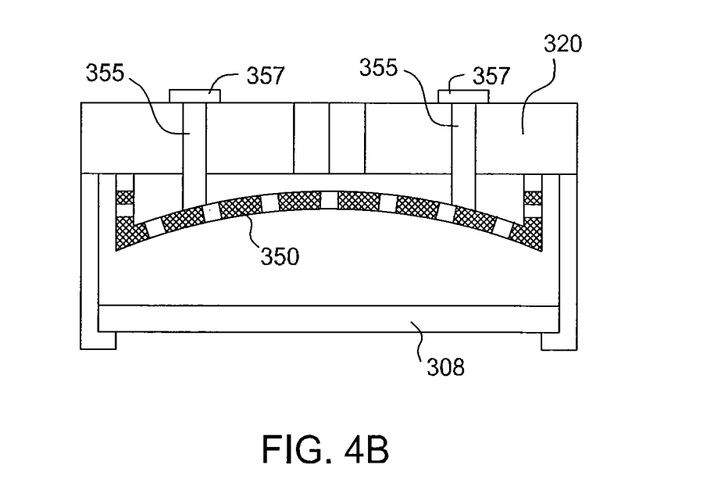
FIG. 4B is a schematic, cross-sectional view of the blocker plate in FIG. 3 with a concave surface contour.

In certain embodiments of the present invention, the surface contour of the blocker plate 350 may be altered to provide desired flow and pressure differential of process gas across the showerhead 308. FIG. 4A is a schematic, cross-sectional view of the blocker plate 350 with a convex surface contour, which may provide a different flow and pressure differential to a central region of the showerhead 308 than to edge and corner regions of the showerhead 308. FIG. 4B is a schematic, cross-sectional view of the blocker plate 350 with a concave surface contour, which also may provide a different flow and pressure differential to a central region of the showerhead 308 than to edge and corner regions of the showerhead 308. In one embodiment, the blocker plate gas passages 356 may be oriented perpendicular to a tangential line of the surfaces of the blocker plate 350 as shown. In another embodiment, the blocker plate gas passages 356 may be oriented perpendicular to an upper surface of the showerhead 308.

In one embodiment, the contour of the blocker plate 350 may be manipulated in situ via automatic raising and lowering of a central region of the blocker plate 350. For instance, the support members 355 may attach to the blocker plate 350 and extend through the backing plate 320 where actuators 357, such as stepper motors, linear motors, or pneumatic cylinders, may raise and lower a region of blocker plate 350 without breaking vacuum in the process chamber 300.

Figure 5:
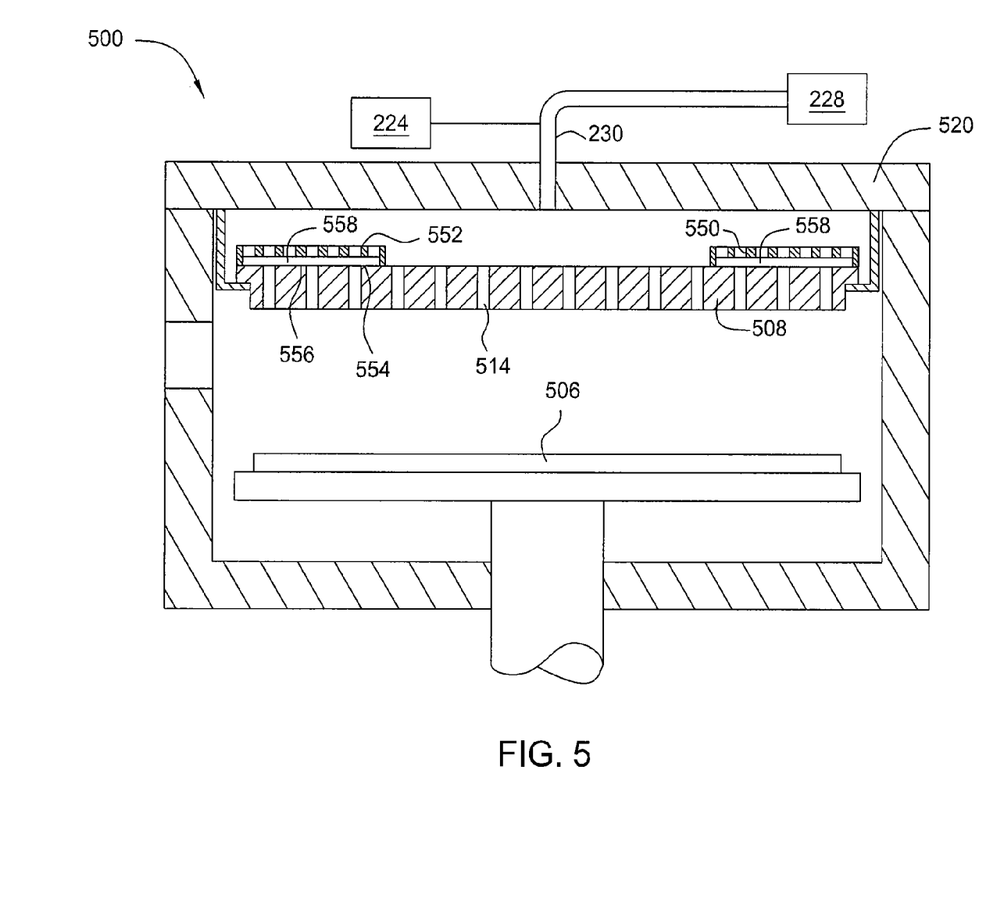
FIG. 5 is a schematic, cross-sectional view of a process chamber according to another embodiment of the present invention.

In certain embodiments of the present invention, regional blocker plates may be used to provide desired flow and pressure differential of process gas across a showerhead. FIG. 5 is a schematic, cross-sectional view of a process chamber 500 according to another embodiment of the present invention.

In one embodiment, the process chamber 500 includes one or more regional blocker plates 550 disposed between a backing plate 520 and a showerhead 508. The blocker plates may have a plurality of gas passages 556 configured through the blocker plates between an upstream side 552 and a downstream side 554.

In one embodiment, the regional blocker plates 550 are coupled to the showerhead 508. In one embodiment, the regional blocker plates 550 are disposed about a peripheral region of the showerhead 508 as depicted in FIG. 5. In another embodiment, the regional blocker plates 550 are disposed on a central region of the showerhead 508.

In one embodiment, the gas passages 556 are aligned with gas passages 514 in the showerhead 508. In another embodiment, some gas passages 556 are aligned with certain gas passages 514, and blocker plate 550 blocks other gas passages 514. Thus, the flow and pressure differential of process gas across the showerhead 508 may be altered as desired by controlling the alignment of gas passages 556 with gas passages 514. In one embodiment, the alignment of gas passages 556 with gas passages 514 may be controlled by relocating the blocker plate 550 with respect to the showerhead 508. In another embodiment, the alignment of gas passages 556 with gas passages 514 may be controlled by substituting one blocker plate 550 with another blocker plate 550 having a different gas passage configuration.

In one embodiment, the gas passages 556 may be larger or smaller than the gas passages 514. In another embodiment, the distance between the upstream side 552 and the downstream side 554 may be varied as well. Both varying the size of the gas passages 556 with respect to the gas passages 514 and varying the distance between the upstream side 552 and the downstream side 554 of the regional blocker plates 550 allow control of the flow and pressure differential of process gas supplied to certain regions of the showerhead 508, resulting in desirable deposition characteristics of a substrate 506 disposed therebelow.

In one embodiment, the regional blocker plates 550 may be spaced above the showerhead 508 such that a plenum 558 is formed therebetween to ensure dispersion of gases between the regional blocker plates 550 and the showerhead 508.

Figure 6:
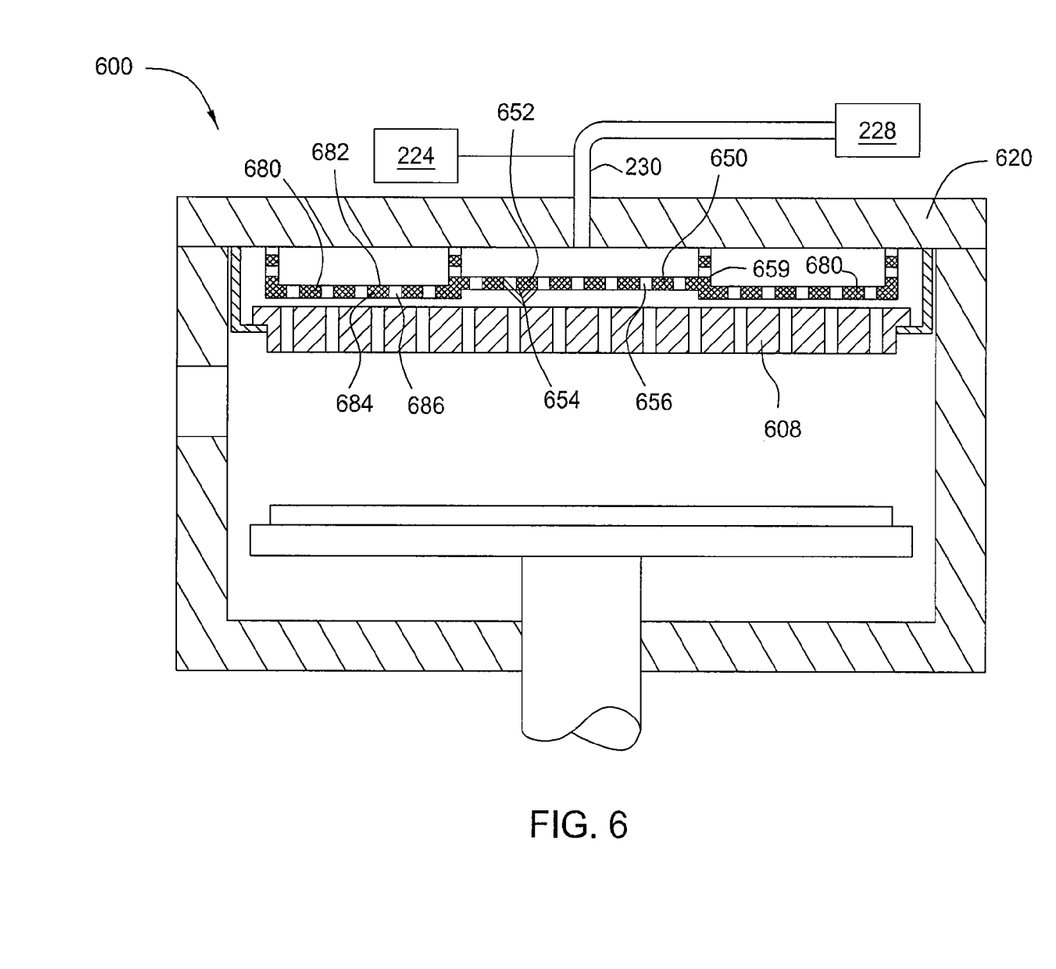
FIG. 6 is a schematic, cross-sectional view of a process chamber according to another embodiment of the present invention.

FIG. 6 is a schematic, cross-sectional view of a process chamber 600 according to another embodiment of the present invention. In one embodiment, a central blocker plate 650 is disposed between a backing plate 620 and a showerhead 608. In one embodiment, a peripheral blocker plate 680 is disposed between the backing plate 620 and the showerhead 608 about the periphery of the central blocker plate 650.

In one embodiment, the central blocker plate 650 has an upstream side 652 and a downstream side 654 with a plurality of gas passages 656 disposed therethrough. Additionally, the peripheral blocker plate 680 may have an upstream side 682 and a downstream side 684 with a plurality of gas passages 686 disposed therethrough. In one embodiment, a plurality of gas passages 659 are disposed between the central blocker plate 650 and the peripheral blocker plate 680 as well.

In one embodiment, the downstream side 654 of the central blocker plate 650 may be farther from the showerhead 608 than the downstream side 684 of the peripheral blocker plate 680. In another embodiment, the downstream side 654 of the central blocker plate 650 may be closer to the showerhead 608 than the downstream side 684 of the peripheral blocker plate 680. By varying the distance between the blocker plates 650, 680 and the showerhead 608, a different flow and pressure differential of process gas may be achieved across a central region of the showerhead 608 than a peripheral region of the showerhead 608.

In one embodiment, the distance between the upstream side 652 and the downstream side 654 of the central blocker plate 650 may be greater than the distance between the upstream side 682 and the downstream side 684 of the peripheral blocker plate 680. In another embodiment, the distance between the upstream side 652 and the downstream side 654 of the central blocker plate 650 may be less than the distance between the upstream side 682 and the downstream side 684 of the peripheral blocker plate 680. In other words, the thickness of the central blocker plate 650 may be varied with respect to the thickness of the peripheral blocker plate 680. Varying the thickness of the blocker plates 650, 680 with respect to one another may provide different flow and pressure differential of process gas across central and peripheral regions of the showerhead 608.

Other embodiments include variations of the gas passages 656 with respect to the gas passages 686 for controlling the flow and pressure differential of process gas across the showerhead 608. In one embodiment, the size of the gas passages 656 may be greater or less than the size of the gas passages 686. In one embodiment, the spacing between the gas passages 656 may be greater or less than the spacing between gas passages 686. In one embodiment, the angle of the gas passages 656 may be different than the angle of the gas passages 686.

Figure 7A:
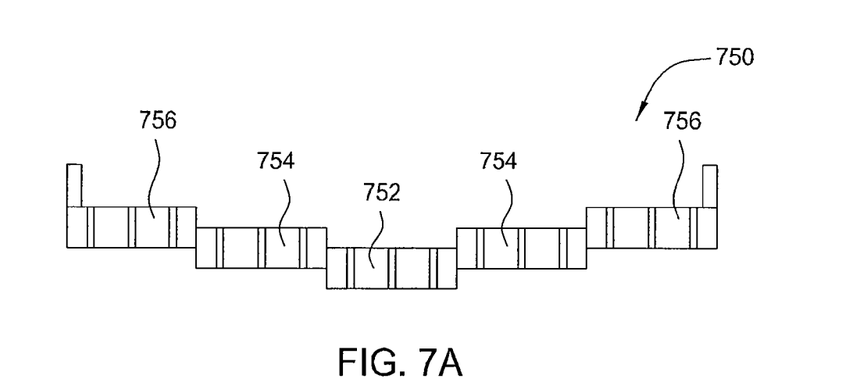
FIGS. 7A-7C are schematic, cross-sectional views of a blocker plate according to one embodiment of the present invention.
Figure 7B:
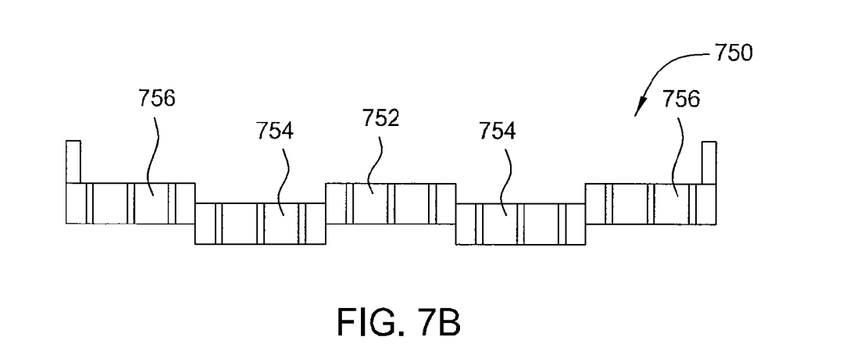
Figure 7C:
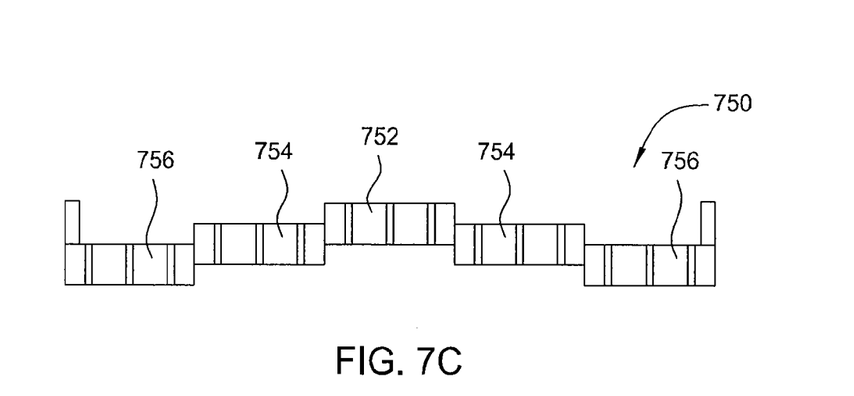

FIGS. 7A-7C are schematic, cross-sectional views of a blocker plate 750 having a plurality of regional zones. In one embodiment, shown in FIG. 7A, the blocker plate 750 comprises a central zone 752 surrounded by a peripheral zone 756 with an intermediate zone 754 disposed therebetween. In this embodiment, the blocker plate 750 simulates a convex shape, such as that shown in FIG. 4A.

In another embodiment, shown in FIG. 7B, the blocker plate 750 comprises a central zone 752 surrounded by a peripheral zone 756 with a lowered intermediate zone 754 disposed therebetween. In this embodiment, the blocker plate 750 has a varied surface contour.

In yet another embodiment, shown in FIG. 7C, the blocker plate 750 comprises a central zone 752 surrounded by a peripheral zone 756 with the intermediate zone 754 disposed therebetween. In this embodiment, the blocker plate 750 simulates a concave shape, such as that shown in FIG. 4B.

Therefore, embodiments of the present invention provide apparatus and methods for altering the flow and pressure differential of process gas across a showerhead in order to improve thin film deposition uniformity across the surface of a large area substrate disposed therebelow.

While the foregoing is directed to embodiments of the present invention, other and further embodiments of the invention may be devised without departing from the basic scope thereof, and the scope thereof is determined by the claims that follow.

The invention claimed is:

1. A processing apparatus, comprising:
a backing plate having an aperture in fluid communication with a gas source;
a showerhead coupled to the backing plate and having a plurality of orifices disposed from an upstream side to a downstream side thereof; and
a blocker plate having gas passages sized and configured to establish a pressure gradient across the blocker plate, and disposed between the backing plate and the showerhead such that a first plenum is formed between the backing plate and the blocker plate and a second plenum is formed between the blocker plate and the showerhead, wherein the volume of the first plenum is adjustable with respect to the volume of the second plenum.

2. The processing apparatus of claim 1, further comprising a support member and an actuator configured to adjust the contour of the blocker plate in situ.

3. The processing apparatus of claim 1, wherein the blocker plate has an upstream and downstream side thereof, and wherein the downstream side has a convex surface contour.

4. A processing apparatus, comprising:
a backing plate having an aperture in fluid communication with a gas source;
a showerhead coupled to the backing plate and having a plurality of orifices disposed from an upstream side to a downstream side thereof; and
a blocker plate having gas passages sized and configured to establish a pressure gradient across the blocker plate, and disposed between the backing plate and the showerhead such that a first plenum is formed between the backing plate and the blocker plate and a second plenum is formed between the blocker plate and the showerhead, wherein the volume of the plenums vary across the area of the showerhead.

5. A processing apparatus, comprising:
a backing plate having an orifice disposed therethrough and in fluid communication with a gas source;
a showerhead having a plurality of gas passages disposed therethrough; and
a blocker plate having a plurality of gas passages disposed therethrough sized and configured to establish a pressure gradient across the blocker plate, and coupled to the showerhead such that a first gas passage disposed through the showerhead is aligned with a gas passage disposed through the blocker plate and a second gas passage disposed through the showerhead is blocked by the blocker plate,
wherein the blocker plate forms a first plenum with the backing plate and a second plenum with the showerhead, wherein the volume of each plenum varies across the area of the backing plate.

6. The processing apparatus of claim 4, wherein the blocker plate has a bottom that has a non-planar downstream surface.

7. The processing apparatus of claim 4, wherein the blocker plate has a gas passage disposed therethrough that is non-perpendicular with respect to a top surface of the showerhead.

8. The processing apparatus of claim 4, further comprising a support member and an actuator configured to adjust the contour of the blocker plate in situ.

9. The processing apparatus of claim 4, wherein the blocker plate has a plurality of gas passages disposed between an upstream and downstream side thereof, and wherein the downstream side has a convex surface contour.

10. The processing apparatus of claim 4, wherein the blocker plate is positioned in a central region of the showerhead.

11. The processing apparatus of claim 5, wherein the blocker plate has a bottom that has a non-planar downstream surface.

12. The processing apparatus of claim 5, wherein the blocker plate has at least one gas passage disposed therethrough that is non-perpendicular with respect to a top surface of the showerhead.

13. The processing apparatus of claim 5, further comprising a support member and an actuator configured to adjust the contour of the blocker plate in situ.

14. The processing apparatus of claim 5, wherein the blocker plate has a convex surface contour.

15. The processing apparatus of claim 5, wherein the blocker plate is positioned in a central region of the showerhead.

16. The processing apparatus of claim 1, wherein the blocker plate has a bottom that has a non-planar downstream surface.

17. The processing apparatus of claim 1, wherein the blocker plate has a gas passage disposed therethrough that is non-perpendicular with respect to a top surface of the showerhead.

18. The processing apparatus of claim 1, wherein the blocker plate is positioned in a central region of the showerhead.

* * * * *